United States Patent [19]

Gerlach et al.

[11] 4,048,498
[45] Sept. 13, 1977

[54] SCANNING AUGER MICROPROBE WITH VARIABLE AXIAL APERTURE

[75] Inventors: Robert L. Gerlach, Minnetonka; Paul W. Palmberg, Bloomington, both of Minn.

[73] Assignee: Physical Electronics Industries, Inc., Eden Prairie, Minn.

[21] Appl. No.: 719,463

[22] Filed: Sept. 1, 1976

[51] Int. Cl.² .......................................... H01J 39/00
[52] U.S. Cl. ................................ 250/305; 250/511; 250/513
[58] Field of Search ............... 250/305, 511, 281, 282, 250/512, 513

[56] References Cited

U.S. PATENT DOCUMENTS

| 2,352,043 | 6/1944 | Ardenne | 250/511 |
| 2,806,147 | 9/1957 | Stellmacher et al. | 250/511 |
| 2,852,684 | 9/1958 | Payne | 250/511 |
| 3,699,331 | 10/1972 | Palmberg | 250/305 |
| 3,735,128 | 5/1973 | Palmberg | 250/305 |

*Primary Examiner*—Alfred E. Smith
*Assistant Examiner*—B. C. Anderson
*Attorney, Agent, or Firm*—Schroeder, Siegfried, Ryan & Vidas

[57] ABSTRACT

A scanning Auger microprobe in a cylindrical mirror analyzer is provided wherein an aperture plate at the exit stage is controllably variable in aperture size and is positioned near the second order focus point and at the minimum trace of the analyzer. Control of the aperture size is provided in both an infinitely variable arrangement and in a three size exit aperture arrangement.

14 Claims; 17 Drawing Figures

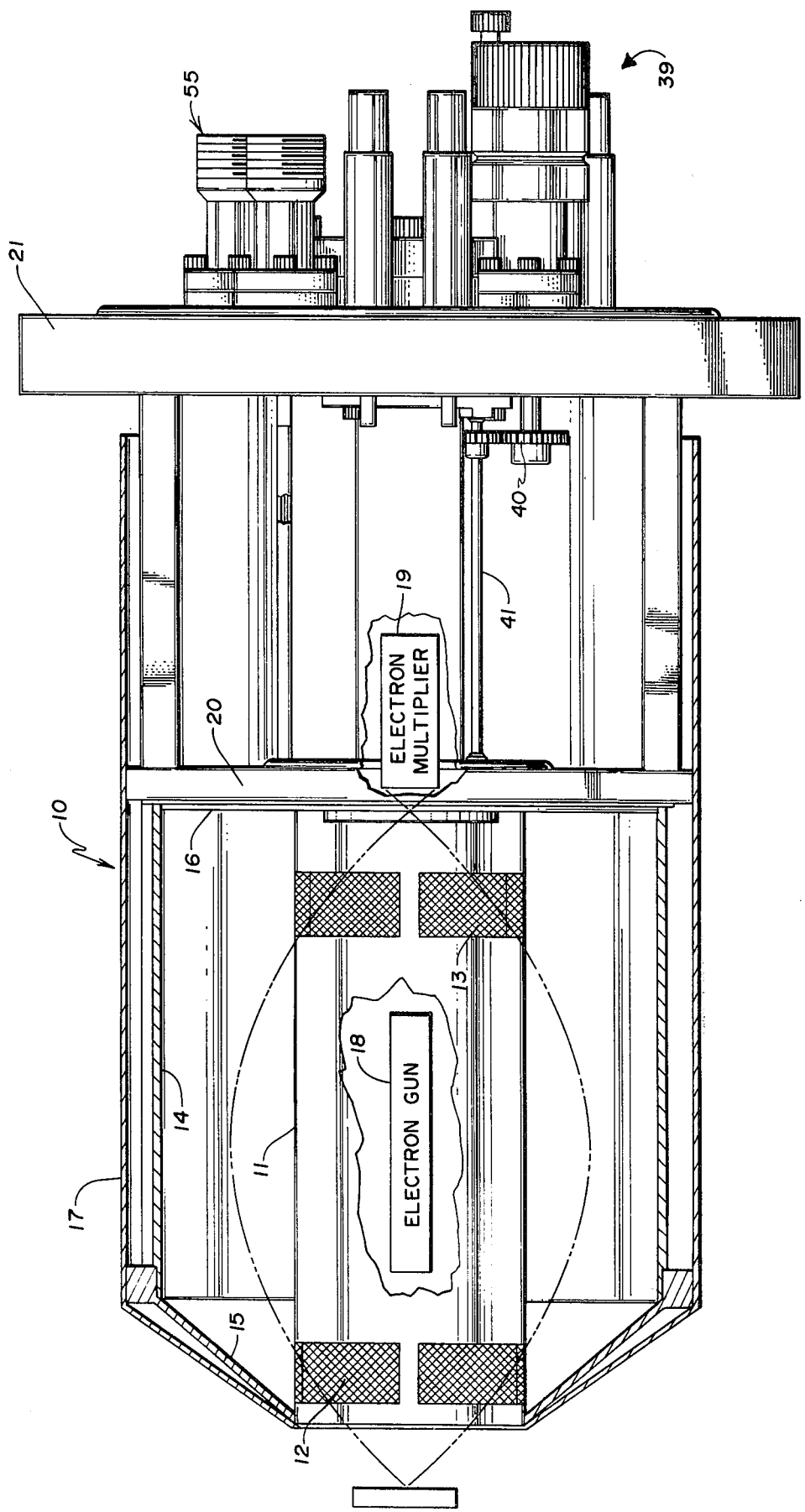

1MM

1MM

1MM

1MM

1MM

1MM

SCANNING AUGER MICROPROBE WITH VARIABLE AXIAL APERTURE

The present invention is directed to a scanning Auger microprobe (SAM) utilizing a cylindrical mirror analyzer (CMA) wherein the CMA is constructed so that the minimum trace width of the analyzed electrons is produced on the axis of the instrument. At the point of focus of the minimum trace, there is provided a multiply variable exit aperture for purposes that will be described herein below.

Scanning Auger microprobes have been known for some period of time. However, such prior scanning Auger microprobes for several reasons lack the desirable versatility of operation that is now possible through our invention. A summary of the history of scanning Auger instruments as well as discussion of principles and use of the present invention is contained in a joint paper with N. C. MacDonald at the IITRI Symposium on Apr. 12, 1976 entitled RECENT ADVANCES IN SCANNING AUGER INSTRUMENTATION. The reader is referred to this paper for some discussions concerning both prior art as well as the electronics that are associated with such instruments including the present invention.

Another paper of interest is entitled A COMBINED ESCA AND AUGER SPECTROMETER by P. W. Palmberg in the *Journal of Vacuum Science and Technology*, 12 No. 1 for Jan./Feb. 1975. In this double pass cylindrical mirror analyzer combined instrument there is provided a means for simultaneously changing both the intermediate aperture and final exit aperture sizes to accommodate ESCA and Auger analysis in the single instrument.

THE INVENTION

In accordance with the present invention, the SAM instrument of a single pass CMA is designed and constructed to have the capability of varying exit aperture size in accordance with the needs and desires of the operator. Heretofore SAM CMA's have been constructed utilizing a fixed single aperture of a size chosen to give a single instrument resolution, R, providing the designer's intention of what is in his estimate the best compromise of resolution versus signal to noise ratio. By use of a small exit aperture a high resolution R is obtained, but at the sacrifice of signal to noise ratio (S/N). Also, the maximum area that can be scanned is determined for a given instrument by the resolution of that instrument. The capability of distinguishing closely spaced peaks on a plot of dN/dE versus electron energy depends upon the resolution of the instrument. For low electron energy, one can generally distinguish most peaks of interest even when the resolution is as high as about 1%. For higher electron energies a resolution of less than 0.5% is required to obtain the needed degree of discrimination. Also, in accordance with our invention, the minimum trace point of the analyzed electrons is positioned along the axis of the instrument.

The invention will be most readily understood in conjunction with the several figures presented herewith.

IN THE DRAWINGS

FIG. 2 is a side, cross-sectional view of a single pass cylindrical mirror analyzer with an integral electron gun and including the multiple exit aperture sizes of the invention;

Figure 3A:
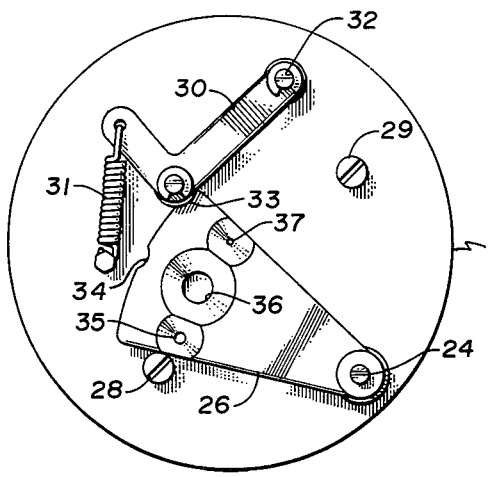
Figure 3B:
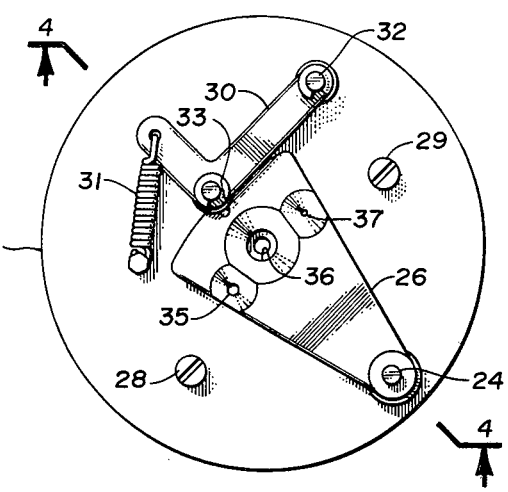
Figure 4:
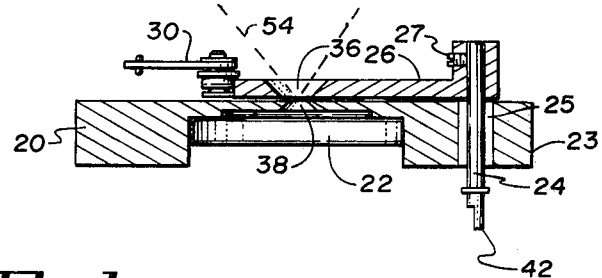
Figure 5A:
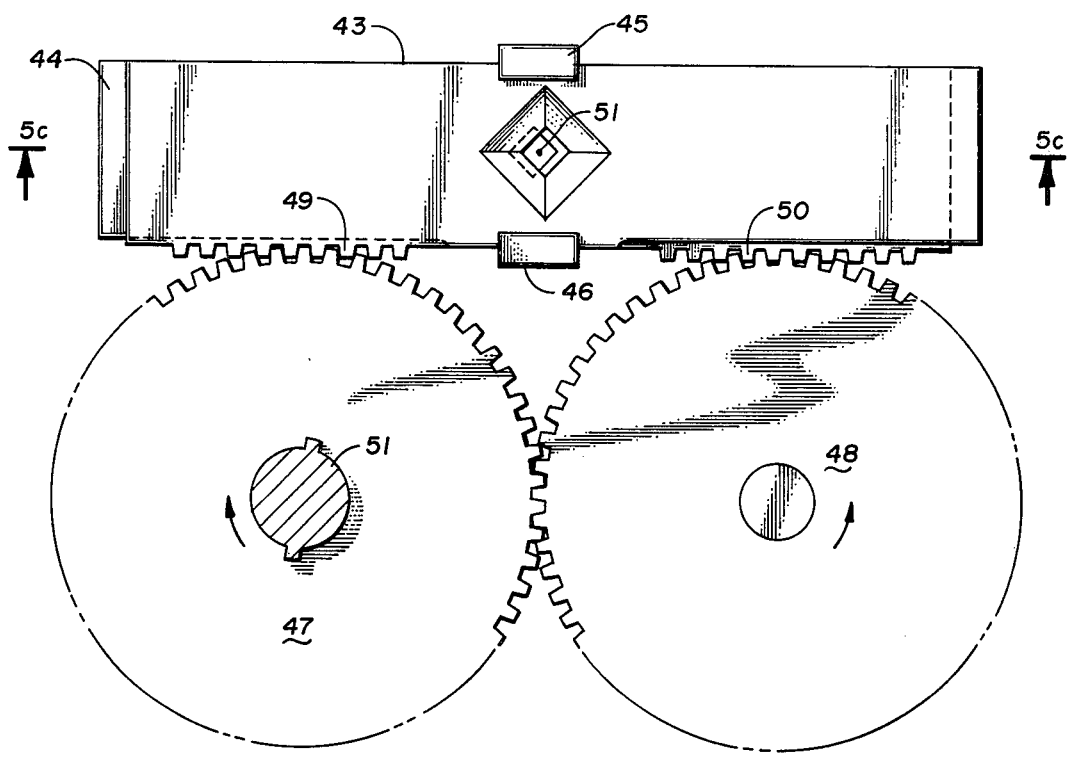
Figure 5C:
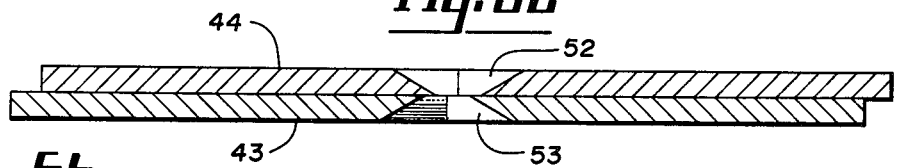
Figure 5B:
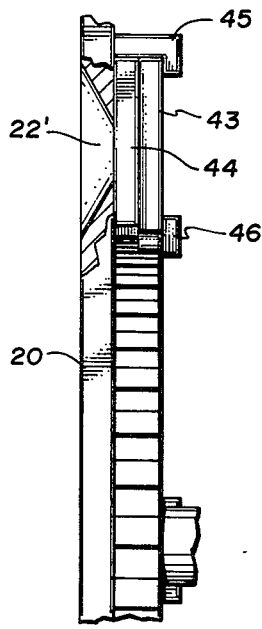
Figure 6A:
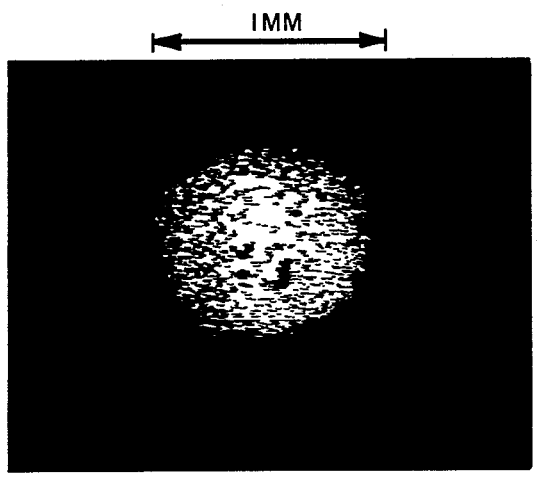
Figure 7A:
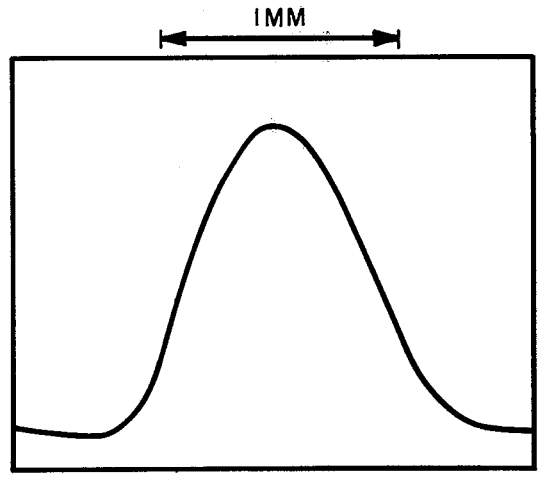
Figure 6B:
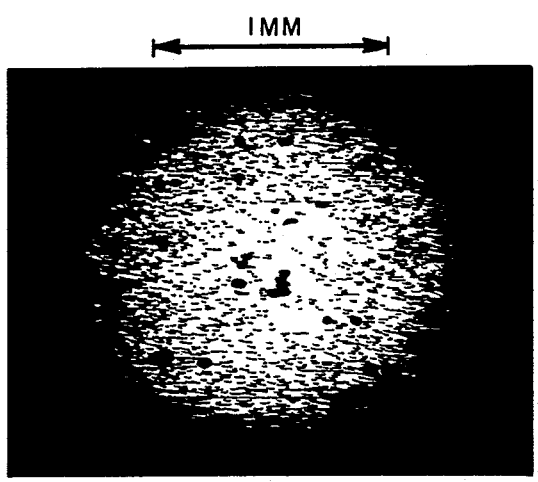
Figure 6C:
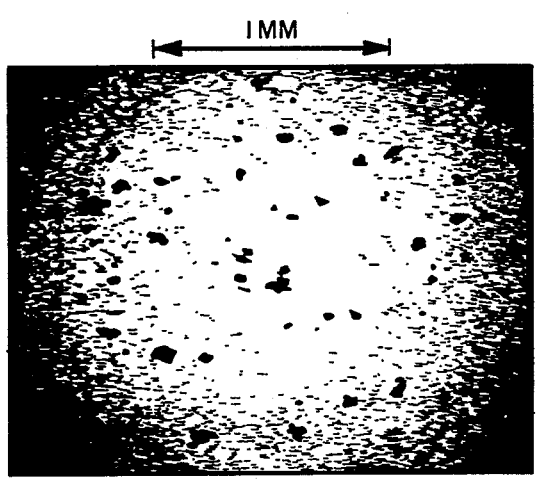
Figure 8:
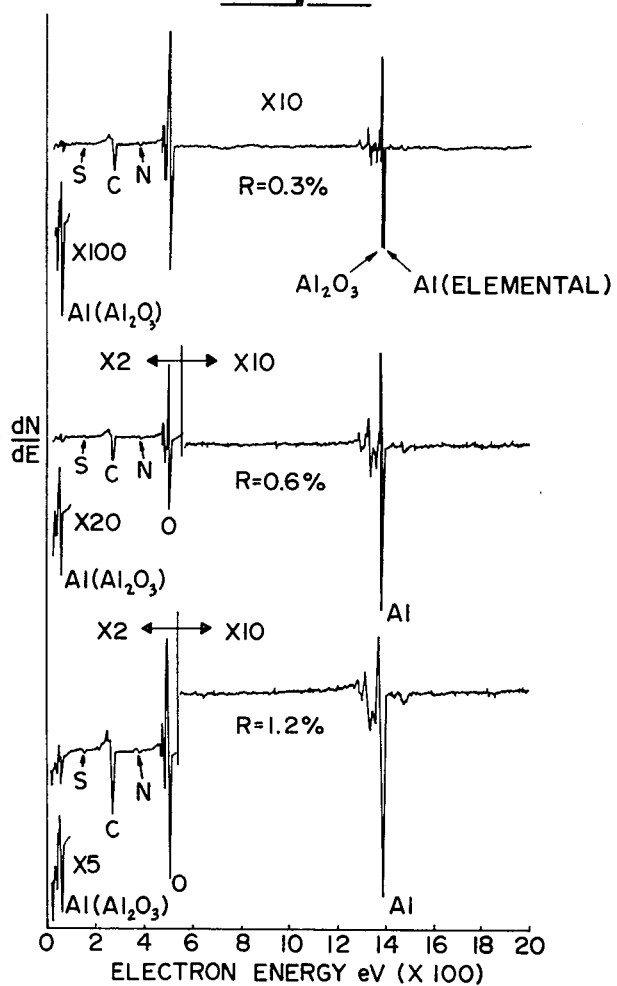
Figure 8A:
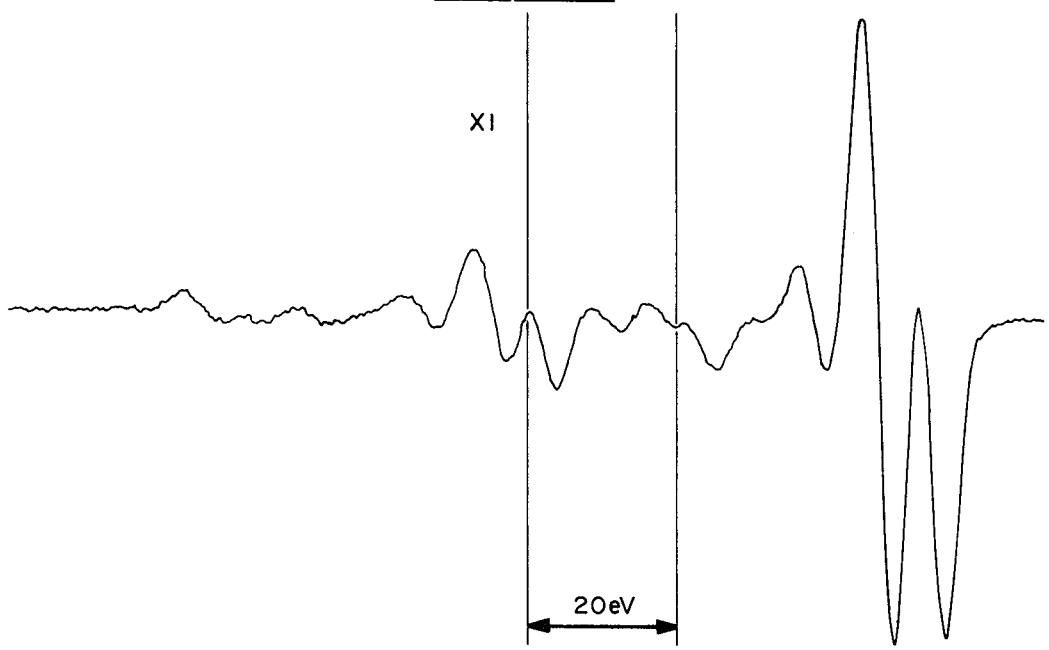

FIGS. 3(a), (b), and (c), are plan views of the aperture plate of the invention showing the detent structure and multiple orifice sizes;

FIG. 4 is a side cross-sectional view along the lines 4—4 of FIG. 3(b);

FIG. 5(a), is a somewhat schematic front elevational view of an infinitely variable aperture plate for an alternative form of the invention including the drive mechanism for changing aperture size;

FIG. 5(b) is an end elevational view of FIG. 5(a); and,

FIG. 5(c) is a cross-sectional view along lines 5c—5c FIG. 5(a);

FIG. 6(a) (b) (c) is a representation of a cathode ray tube Auger image of a scan at 700eV utilizing three different exit aperture sizes;

FIG. 7(a) (b) (c) is a plot of analysis area versus energy resolution for the three images of FIG. 6;

FIG. 8 is a plot of dN(E)/dE for three aperture sizes for an aluminum specimen;

FIG. 8(a) is a portion at approximately 1400eV for the small aperture of FIG. 8 showing the discrimination capabilities between aluminum metal and aluminum oxide.

Figure 1:
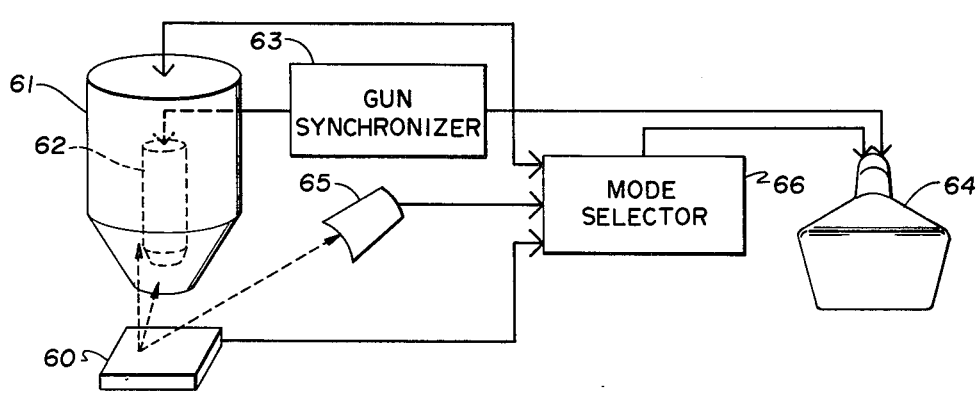
FIG. 1 is a schematic illustration of a SAM instrument and peripheral equipment in which the invention is used.

Referring first to FIG. 1 there is shown in schematic form a SAM instrument and a schematic representation of attendant electronic components utilized with such instruments. The sample 60 is positioned adjacent the open end of the CMA 61 having integral electron gun 62. Gun 62 is of the type capable of having the electron beam controlled to scan a raster area defined by the sample surface. Gun synchronizer means 63 controls the scan and also synchronizes the display on a CRT 64. A secondary electron detector 65 is provided to give additional flexiblity to the instrument. A mode selector 66 is provided for selection of the desired signal. Such instruments have been available on the market for some time.

Turning now to FIG. 2, there is illustrated therein and in cross sectional view, a cylindrical mirror analyzer 10 of a generally conventional design except as will be noted. The overall length of the analyzing portion of the analyzer 10 has been lengthened slightly so that the point of minimum trace of the electrons being analyzed is at the axis line of the instrument, rather than being off axis as is conventionally the case. See *Review of Scientific Instruments*, 12 No. 6 for June 1971, Analysis of the Energy Distribution in Cylindrical Electron Spectrometer by S. Aksela. The analyzing portion of the instrument consists of an inner metallic tube member 11 which is provided with annular openings 12 and 13 adjacent the remote ends thereof. Openings 12 and 13 are desirably covered with a fine mesh metallic screen manufactured of a non-magnetic material as is the tube 11. An outer metallic tube member 14 is in axial alignment with the inner tube 11 and is spaced therefrom by insulating ceramic members 15 and 16. As shown insulator 15 is of a truncated cone configuration so as to permit positioning of an exterior electron gun or other instrument adjacent the sample as is known in the art. Insulators 15 and 16 are desirably field termination plates of the types described in U.S. Pat. Nos. 3,735,128 and 3,818,228 to Palmberg assigned to the same assignee as the present invention. A mumetal jacket 17 surrounds the entire analyzing instrument so as to provide additional shielding from any stray magnetic fields which adversely affect the analysis.

Positioned in the interior tube 11 and spaced between openings 12 and 13 is an integral electron gun 18. An integral electron gun is described in more detail in U.S. Pat. No. 3,739,170 to Bohn. By focusing of the electron gun, larger spot sizes may also be produced. The current desired in the gun for analysis purposes is large enough that the $LaB_6$ Cathode is desirable to provide a long lifetime prior to replacement. The design of a scanning electron gun is also known in the art. As the electron gun per se is not a portion of the invention, and is dealt with in detail in the literature, it will not be described with greater detail here. The literature describes in detail many types of electron guns generally suitable for the purpose and those skilled in the art where necessary can modify such electron guns to fit the space available.

Within outer housing member 17, there is also provided a detector for the analyzed electrons which is conveniently an electron multiplier 19 of the type commonly in use for this purpose. A relatively heavy plate member 20 having an opening through the center thereof for passage of the electrons that have been analyzed provides a support for the variable aperture assembly which will be described below. The entire CMA that has been described is mounted to a large flange member 21 which, when the apparatus is in use, is a portion of the wall of a high vacuum chamber.

Figure 3C:
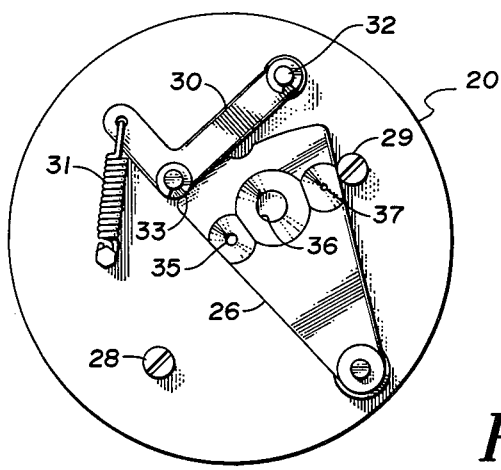

Turning now to FIGS. 3(a), 3(b), 3(c) and to FIG. 4, there is illustrated in various views one form to the invention wherein there are three aperature sizes that can be selected at the desire of the user of the invention. In the several figures, like parts will be given the same numerical designation. Plate 20 is provided with a recess and opening therethrough as best seen in FIG. 4 wherein it is generally designated as 22. Plate 20 for clarity of the illustration has not been drawn with the necessary openings therethrough for providing power to the electron gun nor with the various mounting screws necessary to attach it to the overall assembly.

Plate 20 is provided with a journal assembly 23 through which a rotatable shaft 24 passes through bearings 25. Fixed onto shaft 24 by means such as a set screw 27 is a shutter plate 26. The dashed lines 54 represent the cone of incident electrons from the analyzer which converge on the exit aperture. Shutter plate 26 is mounted for rotation with shaft 24 between three separate positions. These positions are defined at the extremities by stops 28 and 29 which limit the rotation of shutter 26. A central stop position is provided by the spring-loaded arm 30 which is biased by means such as spring 31 to bear against the outer edge of shutter plate 26. Arm 30 is mounted for limited rotation about a pivot means 32. At the elbow portion of the arm there is provided a detent member 33 that is positioned so as to intercept the recessed portion 34 in the outer periphery of shutter plate 26. Shutter plate 26 is provided with three spaced openings therethrough 35, 36, and 37. These openings are positioned so as to be in axial alignment with the chamfered opening 38 in the plate member 20 dependent upon the position of the shutter plate 26. While the specific arrangement of openings in shutter plate 26 may be in any order desired, the figure shows that opening 36 is of a larger minimum diameter than is opening 38. Opening 38 then defines the orifice size for the aperture of the analyzer when the shutter plate is in this position. Openings 35 and 37 are respectively smaller than opening 36 and of different sizes for the purposes that will be described. When the smaller openings are in alignment with opening 38, the smaller opening defines the exit aperture. The three openings in shutter plate 26 are desirably from largest to smallest: 0.120, 0.052, and 0.025 inches in diameter. The hole 38 in base plate 20 which defines the orifice size for the case of the largest opening in shutter plate 26 in 0.100 inches.

While shutter plate 26 is shown as positioned on the inner wall of plate 20 toward the source of electrons being analyzed, it may also be on the opposite side. By placing it on the inner wall, there are less problems with positioning of the electron multiplier 19 on the outer side of plate 20.

Referring again to FIG. 2, it will be seen that a rotary feedthrough assembly generally designated 39 is provided for passage through plate 21 to provide for mechanical movement of shutter plate 26 from one position to another. The specific manner of passing mechanical motion through the vacuum seal forms no immediate part of the present invention and may be conveniently done with commercially available equipment. Interior to the vacuum chamber holding the analyzing equipment the rotary feed through is connected by means of gear coupling assembly 40 to drive a shaft 41 that in turn is in engagement with plate 26 via shaft 24. The end 42 of the shaft 24 is adapted to be joined in rotating arrangement with drive shaft 41. Thus, one may rotate plate 26 from outside of the vacuum chamber to position the shutter plate in any one of the three desired positions. Of course, plate 21 will also be equipped with suitable feedthroughs 55 for electrical leads and the like as is conventional in this art.

Referring now to FIGS. 5(a) (b) (c), there is shown respectively, a front elevational view, side elevational view and cross-sectional view of an alternative technique in accordance with the invention of providing an essentially infinitely variable aperture at the exit plate of the instrument. The balance of the CMA is the same as in the foregoing description with the changes to the instrument as will be detailed below.

The mounting plate 20 is provided with a somewhat larger aperture 22' than was the case for that shown in connection with FIGS. 3 and 4. The reason for this is that the opening 22' does not define the exit aperture as was the case in the one of the three possibilities of FIGS. 3 and 4. The exit aperture is entirely defined by the two movable plate members 43 and 44. Plate members 43 and 44 are mounted in sliding engagement with one another and held in position against plate 20 by means such as clip angles 45 and 46. Also mounted on plate 20 for rotation are gear wheels 47 and 48 which are meshed so as to counter-rotate with respect to one another. Gear wheel 47 is in engagement with a rack gear 49 on plate 43 while gear 48 is in engagement with rack gear 50 on plate 44. Gear 47 is provided with a means such as a keyed slot 51 for engagement with arm 41 of the rotary feedthrough mechanism. It can thus be seen that as gear 47 is rotated in either a clockwise or counterclockwise direction that gear 48 will rotate in a counter direction to gear 47 and each of the gears 47 and 48 will repectively move plates 43 and 44.

Plate 43 and plate 44 are each provided with rectangular shaped openings 52 and 53 which are positioned in the orientation shown. Opening 52 is provided with sloped walls opening towards the interior of the instrument while plate 43 is provided with opening 53 and has sloped walls opening out towards the exit side of the instrument toward the detector. The orientation of the two openings is such that as plates 43 and 44 move with respect to one another, a rectangularly shaped opening is provided of varying size over an essentially infinite range of possibilities limited only by the fineness of the teeth on gears 47 and 48 and the rack gears 49 and 50. Thus, one can have the exterior rotary feedthrough marked so as to be able to set predetermined opening sizes for the exit aperture. As can be seen, the center of the exit aperture is located along the axis 51 of the analyzer and remains concentric therewith irrespective of the size of the opening produced by movement of plates 43 and 44.

It will, of course, be understood that the aperture plate of FIG. 3 may have two or more openings therein for movable alignment with the axis of the analyzer. Similarly, rather than a pivoting segment the aperture plate may be a linear slide with openings therethrough that can controllably be slid to align the desired opening with the axis of the instrument.

As has been previously discussed above, the point of minimum trace of the analyzed electrons is by instrument design provided at the axis of the instrument, and this axis and minimum trace point will correspond to the opening of the apertures of either the form shown in FIGS. 3 and 4 or of the form of the invention shown in FIG. 5. This results in maximizing the signal received without the complexities of an off axis annular exit aperture such as has been shown in the prior art.

Some of the advantages to be obtained through the invention will now be illustrated. Turning first to FIG. 6(a) (b) (c), there is shown a representation of the analysis area for different energy resolutions for an instrument in accordance with the present invention. The first FIG. 6(a) shows the Auger image for a 700eV iron spectrum at a resolution R=0.3 percent. The scale of an image is as illustrated. A comparable image attained with R=0.6 percent is shown immediately therebelow in FIG. 6(b), and the third image, at R=1.2 percent. The figures are taken from CRT display photos but have been simplified for ease of presentation. As can be seen, the area of the images is considerably larger for increasing percentage resolution. It will be noted, however, that essentially the same features (dark spots) show up for each of the common analysis areas. Thus, it will be appreciated that for higher percentage resolutions one can obtain images which are for significantly larger areas so as to locate points of interest such as will require more detailed analysis.

Figure 7B:
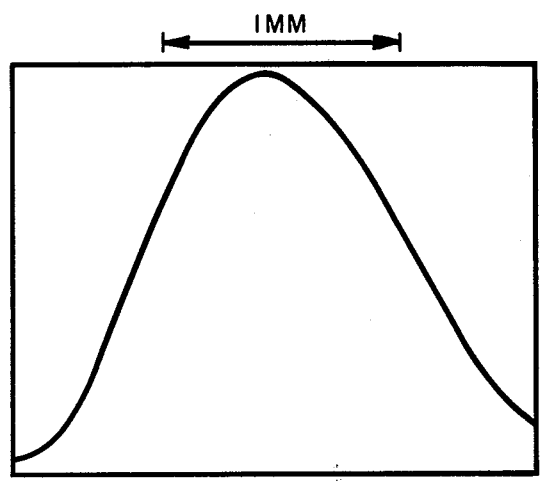
Figure 7C:
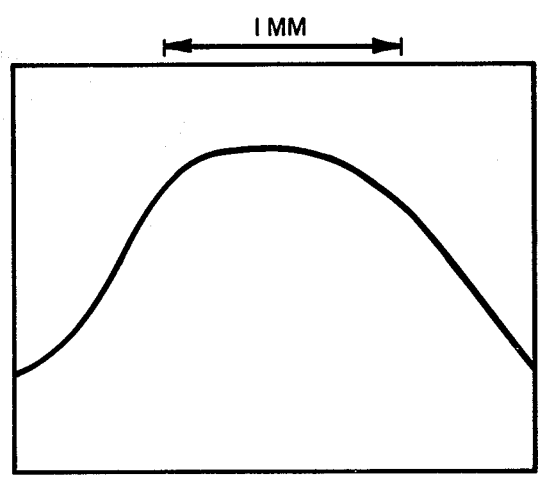

FIG. 7 is a graphical portrayal of the analysis area for different energy resolutions for the specimen of FIG. 6. As can be seen, for a resolution of 0.3 percent, the full width, half maximum (FWHM) of the signal intensity is equal to about 0.8 millimeters whereas for a resolution of 1.2 percent the width is 1.7 millimeters and the signal is relatively constant over a larger distance.

In FIG. 8, there is illustrated a chart of dN/dE to illustrate the energy resolution and chemical effects. Traces are shown for the resolution of the instrument of varying aperture sizes (the resolution for the bottom curve large aperture being 1.2 percent and for the smallest aperture 0.3 percent). The large aperture curve while having a good S/N ratio is incapable of distinguishing between peaks of Al and $Al_2O_3$. In FIG. 8(a) is shown a portion of the curve for R=0.3% amplified as illustrated. It can be seen that for this fine a resolution one can readily distinguish between aluminum and aluminum oxide. For the larger aperture sizes and corresponding higher percentage resolution, it is not possible to provide such a distinguishing of aluminum and aluminum oxide.

When one desires to produce a scan and a CRT display of the results, it is of course of considerable advantage to have a fairly large signal to noise ratio (S/N) so that the signal may be displayed without excessive amplification and blurring of the image due to noise problems. When the signal is relatively large, the time of the scan can be significantly faster than is the case when the signal is very small, even through such a latter signal may have a high degree of resolution. However, in order to have a high signal to noise ratio within the limitation imposed by the nature of Auger analysis, one must admit a larger portion of the signal generated by the same. This inevitably results in a lower resolution capability. In the use of the present invention, one can have the variablity within the instrument to selectively choose the desired resolution and signal to noise ratio capabilities of the instrument without the necessity for braking the vacuum and making changes to the instrument.

The electonics for operation of the system have not been dealt with herein as these are essentially conventional electronics and are discussed in detail in the literature. It suffices to state the electronics should be of a high quality capable of picking up the very small signal involved and of displaying these signals with the precision necessary considering the small size of the electron beam scanned across the samples and the detail that is being sought from the samples.

What I claim is:

1. In a single pass scanning Auger electron analyzer wherein Auger electrons emitted from an irradiated sample pass through a cylindrical mirror analyzer and are analyzed and focused at the axis of the cylindrical mirror analyzer to be detected, the improvement comprising a support member mounted transverse to and extending across the diameter of the inner cylinder of the cylindrical mirror analyzer adjacent to the focus point of said electrons, said support member defining a first opening therethrough along the axis of the cylindrical mirror analyzer for passage of analyzed electrons, a variably sizable exit aperture assembly mounted to said support member, said exit aperture assembly including plate means movable transversely with respect to said cylindrical mirror analyzer, said plate means by movement thereof relative to said support member defining a plurality of different size openings therethrough in axial alignment with the openings in said support member, and control means external to said cylindrical mirror analyzer including linking means operatively joined to said plate means for moving said plate means relative to said support member.

2. The improvement in accordance with claim 1 wherein said exit aperture asembly plate means is a single plate member mounted to said support member for pivotal movement with respect thereto, said plate member defining a plurality of spaced different size openings therethrough.

3. The improvement in accordance with claim 2 wherein detent means are mounted to said support member in position to engage edge portions of said single plate member so that said openings in said plate member are selective alignable with said first opening.

4. The improvement in accordance with claim 3 wherein said detent means include stop members positioned on said support members at remote ends of the pivotal travel of said plate member to intercept and block motion of said plate member thereby to align different size openings in said plate member with said first opening.

5. The improvement in accordance with claim 2 wherein one of said openings in said plate members is larger than said first opening in said support member.

6. The improvement in accordance with claim 2 wherein the plate member is mounted on the internally facing side of said support member and said openings in said plate are in the shape of a truncated cone with the larger open face of said openings toward said analyzer.

7. The improvement in accordance with claim 4 wherein said detent means includes a pivotally mounted arm assembly mounted to said support member, bias means resiliently forcing a portion of said arm assembly into engagement with an edge portion of said plate member, said plate member defining at least one recess in the edge engaged by said arm assembly to thereby defined an opening alignment.

8. The improvement in accordance with claim 1 wherein said exit aperture assembly plate means includes first and second movable plate members mounted to said support member and in at least partial lapping arrangement with respect to one another, portions of said first and second plate members defining jointly an opening therethrough centered on the axis of the cylindrical mirror analyzer.

9. The improvement in accordance with claim 8 wherein each of said plate members defines an opening therethrough that overlap in part one another with the side of each opening in the first and second plate members that overlap defining the joint opening therethrough, the sides of the openings toward one another having a right angle configuration.

10. The improvement in accordance with claim 8 wherein the first plate member towards the interior of the cylindrical mirror analyzer has a chamfered edge opening towards the interior of the cylindrical mirror analyzer and the second plate member has a chamfered edge opening towards the exterior side of said cylindrical mirror analyzer.

11. The improvement in accordance with claim 8 wherein parrallel edges of said first and second plate members define respectively first and second racks and said control means includes first and second pinions mounted to said support member and engaging said first and second racks respectively, said first and second pinions linked to one another so that they rotate in opposite directions to one another thereby moving said first and second plate members in opposite directions to one another.

12. The improvement according to claim 11 wherein said pinions engage one another.

13. In a single pass scanning Auger electron analyzer wherein Auger electrons emitted from an irradiated sample pass through a cylindrical mirror analyzer and are analyzed and focused at the axis of the cylindrical mirror analyzer to be detected, the improvement comprising variable size exit aperture means adjacent the focus point of said electrons, said aperture means including a first plate member mounted in transverse relationship to the inner tube member of said cylindrical mirror analyzer, said first plate member defining an opening therethrough of a first predetermined size in alignment with the axis of said cylindrical mirror analyzer, shutter means, said shutter means compising a second plate member mounted for pivotal movement to a face of said first plate member, said second plate member defining first, second, and third openings therethrough, said first opening being greater in diameter than the opening in said first plate member and said second and third openings being smaller than said first plate opening and of a different size from one another, control means external to said cylindrical mirror analyzer and linked to said shutter plate for pivoting and indexing same selectively to align the openings in said shutter plate with said opening in said first plate.

14. The improvement in accordance with claim 13 wherein said openings are in the shape of truncated cones with the narrow portions of the openings in said shutter means toward the opening in said first plate member.

* * * * *